US006277442B1

(12) United States Patent
Beaumont et al.

(10) Patent No.: US 6,277,442 B1
(45) Date of Patent: Aug. 21, 2001

(54) CLOSED CHAMBER METHOD AND APPARATUS FOR THE COATING OF LIQUID FILMS

(75) Inventors: Guy D. Beaumont, Granby; Germain L. Caron, Dunhan; Francois P. Robillard, Bonsecours, all of (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,964

(22) Filed: Nov. 1, 1999

(30) Foreign Application Priority Data

May 3, 1999 (CA) .................................. 2270807

(51) Int. Cl.[7] ................. B05D 1/18; B05C 3/02
(52) U.S. Cl. .................. 427/294; 427/385.5; 427/430.1; 427/96; 118/59; 118/428; 118/429
(58) Field of Search ................... 427/96, 430.1, 427/240, 443.2, 294, 385.5; 118/429, 428, 50, 50.1, 59

(56) References Cited

U.S. PATENT DOCUMENTS

| 4,590,094 | 5/1986 | Ringer, Jr. .......................... 427/82 |
|---|---|---|
| 4,749,436 * | 6/1988 | Minato et al. ...................... 156/345 |
| 4,941,426 * | 7/1990 | Sago et al. ............................ 118/52 |
| 5,188,669 | 2/1993 | Donges et al. ...................... 118/503 |
| 5,223,037 | 6/1993 | Kraiss et al. ......................... 118/411 |
| 5,232,503 * | 8/1993 | Lewis .................................. 118/421 |
| 5,234,499 | 8/1993 | Sasaki et al. ........................ 118/52 |
| 5,270,079 | 12/1993 | Bok ..................................... 427/429 |
| 5,289,222 * | 2/1994 | Hurtig ................................. 354/317 |
| 5,314,710 * | 5/1994 | Muroyama ........................... 427/96 |
| 5,415,899 | 5/1995 | Nakayama et al. .............. 427/430.1 |
| 5,597,412 * | 1/1997 | Grilletto et al. ..................... 118/50 |
| 5,993,546 * | 11/1999 | Sugai .................................. 118/50 |

FOREIGN PATENT DOCUMENTS 5-234875 * 9/1993 (JP) .

* cited by examiner

Primary Examiner—Katherine A. Bareford
(74) Attorney, Agent, or Firm—James A. Lucas; Driggs, Lucas, Brubaker & Hogg Co., LPA

(57) ABSTRACT

The described invention provides a method and apparatus for coating uniform films on substrates and curing the coatings on the surface. Within an enclosed chamber the object to be coated is positioned and a sufficient amount of liquid material is provided into the chamber to cover the surface of the object to be coated. The excess liquid material is then evacuated from the chamber at a controlled rate to leave a coating of material on the surface of the object.

13 Claims, 2 Drawing Sheets

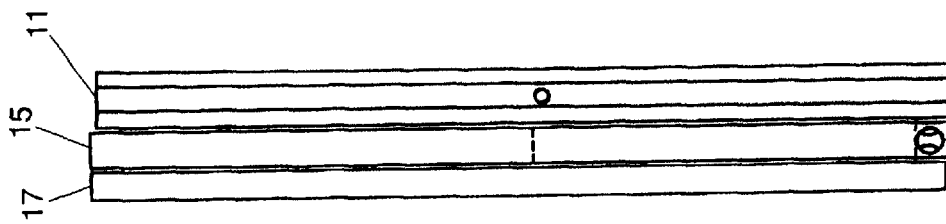
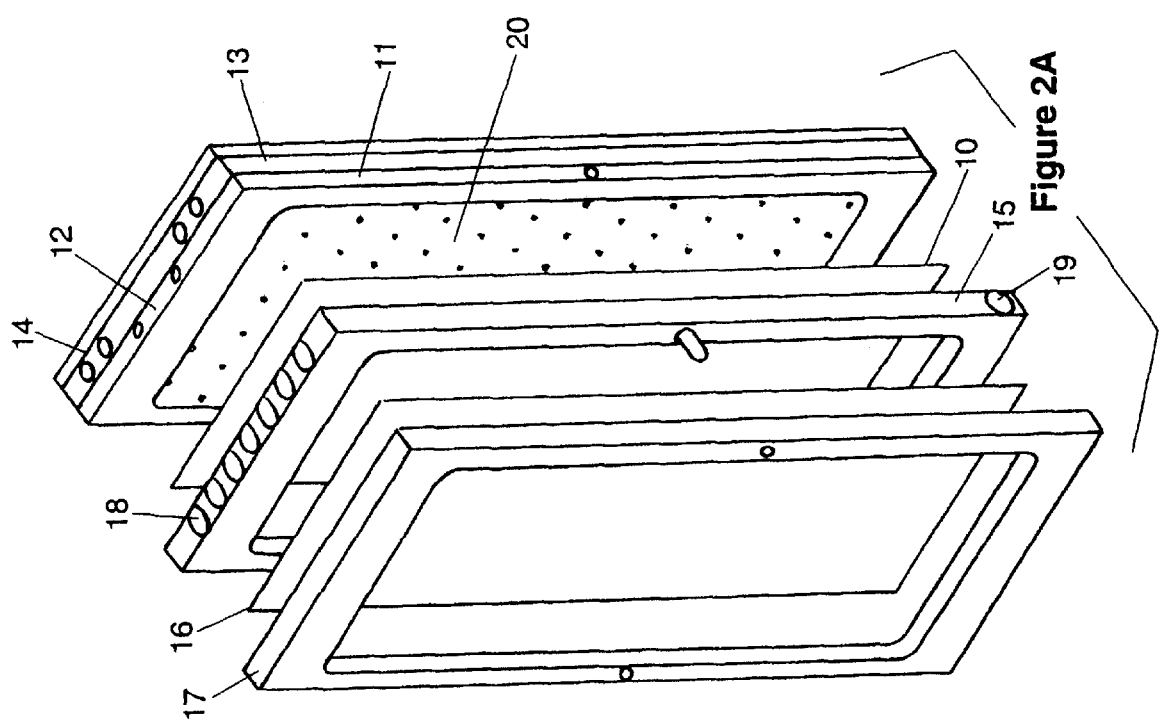

CLOSED CHAMBER METHOD AND APPARATUS FOR THE COATING OF LIQUID FILMS

BACKGROUND OF THE INVENTION

1. Field of the Invention

This invention relates particularly to the integrated circuit industry but more generally to any industry where an application is needed to have a uniform thin film of material formed or deposited on the surface of an object.

There is increasingly a need in various industries and in particular the integrated circuit industry, to be able to provide thin films of controlled thicknesses or coatings of material on surfaces of substrates of various sizes and complexities. The size of these surfaces range from those of small surface areas up to relatively large flat panel displays and large area mask requirements. Present coating systems and methods do not satisfy all of the technical needs and requirements for these applications.

2. Description of the Prior Art

Various methods are presently known and used for coating the surfaces of objects and in particular, the coating of substrates as required in the integrated circuit industry.

Spin coating, where the coating material is deposited on a substrate surface and then the surface is rotated, is known to provide good film uniformity for sizes of substrates less than 10" in diameter. This method, however, results in inefficient coating material usage and a limitation on the size of the surface or substrate that can be coated, due to the requirement for rotation of the object.

Dip coating, where the object to be coated is immersed in a liquid source of the coating material, may be more efficient but it typically results in a film which is not very uniform in its thickness or easily reproducible. Although large size objects can be handled, there is a need for a large liquid reservoir. The dip coating method also has the disadvantage that it does not provide for a closed environment and therefore the coating material and system is susceptible to contamination resulting in defective layers being formed on the surfaces of an object.

Forming a film of material by spraying the material on a surface results in the difficulty to control thickness uniformity for films which are often needed to be less than 1 to 2 microns in thickness. This may result in the efficient use of a coating material and relatively large sized surfaces can be handled, but once again it is not a closed system.

Meniscus coating methods are known whereby a coating material is flowed through a porous applicator onto the surface of the object to be coated. Meniscus of the coating material is formed between the porous applicator and the surface of the object to be coated and the meniscus is maintained during relative movement between the surface and the applicator. An example of such a procedure is described in U.S. Pat. No. 5,270,079 which issued Dec. 14, 1993 to Hendrik F. Bok, entitled "Methods of Meniscus Coating" and assigned to Specialty Coating Systems, Inc. This described procedure results in efficient use of the material. However, the application is limited as to the size of the object that can be coated due to its reliance on the proximity of the physical applicator to the surface of the object in order to maintain the meniscus. The larger the size of surface to be coated, the more difficult to maintain the positioning of the physical applicator with respect to the surface, and therefore variability in the meniscus and hence the film thickness results. Again, this is not a closed environment and contamination of the coating material could result.

Other representative prior art references and the associated shortcomings of their teachings including further details of some of the above methods are now presented.

U.S. Pat. No. 4,590,094 entitled "Inverted Apply Using Bubble Dispense", issued May 20, 1986 to Frederick C. Ringer, Jr., and is assigned to International Business Machines Corporation. The description is of a method and apparatus for coating a substrate comprising a spindle holding a workpiece in an inverted manner so that the face of the workpiece faces downwardly towards a liquid deposit of the coating material which is supported in a nozzle beneath the spindle. The spindle is moved to permit the inverted workpiece to contact the liquid deposit and the spinning spreads the coating material uniformly across the surface of the spinning workpiece. This is an open system and therefore the coating material is susceptible to contamination and would be used in a clean room environment for best results. The size of the substrate that could be coated would be limited to what could be accommodated by the apparatus and the final curing of the coating would be done in a separate bake oven.

U.S. Pat. No. 5,188,669 entitled "Circuit Board Coating Apparatus with Inverting Pallet Shuttle" issued Feb. 23, 1993 to William E. Donges et al. The coating apparatus described has one coating station to coat both opposite surfaces of two-sided circuit boards. One upwardly facing surface of a first circuit board is coated at the coating station and moved to a handling station, while a second circuit board is moved to the coating station where its upwardly facing surface is coated and the first circuit board is inverted in the handling station. The procedure is then continued such that both sides of the circuit boards are coated. A single overhead spray coating station results in both sides of the circuit board being coated without the coating station being idle when the boards are being inverted. Thus, alternate sides of a circuit board are coated and if curing of the coating is required, this would be done in a separate bake oven.

U.S. Pat. No. 5,223,037 entitled "Plant for the Manufacture of Printed-Circuit Boards or Multi-Layers", issued to Niko Kraiss et al on Jun. 29, 1993. This reference describes adjacent modules providing continuous and interconnected processes for producing electrically conductive coatings on printed circuit boards. After a circuit board is prepared at previous modules, the circuit board is passed through a coating module while submersed in the coating liquid before being moved to the final module where the organic coating is polymerized.

U.S. Pat. No. 5,234,499 entitled "Spin Coating Apparatus" issued to Tadashi Sasaki et al on Aug. 10, 1993 and describes spin coating apparatus for use in applying a coating solution to form a film on an upper surface of a substrate. The apparatus includes a rotary table for holding and spinning a substrate in a horizontal manner. An upper rotary plate is parallel to and spaced from the upper surface of the substrate which defines a flat treating space between them. A nozzle plate is disposed between the rotary table and the substrate support which dispenses fluid which is directed to the surface of the substrate.

U.S. Pat. No. 5,415,899 entitled "Method of Forming an Organic Thin Film" issued May 16, 1995 to Toshio Nakayama et al. The described method includes creating organic molecules having a hydrophilic portion and a hydrophobic portion on a water surface. The substrate to be coated is pulled across the surface thereby transferring the portions of the monomolecular layer onto the substrate.

SUMMARY OF THE INVENTION

It is an object of the present invention to provide a new method and apparatus for coating thin films on the surface of objects which overcome the deficiencies of the prior art.

It is a further object of the invention to provide a method and apparatus for creating coating films of various thicknesses and uniformity on the surface of substrates which are of a range of physical sizes.

It is an object of the present invention to provide for coatings of films of materials where the thickness and uniformity of the coating is determined by factors including the viscosity of the liquid material used for the coating and the rate of evacuation of the liquid material from a chamber in which the object being coated is located.

It is a further object of the invention to provide for the use of a method and apparatus resulting in a thin uniform layer of photoresist material on a substrate.

It is a further object of the invention to provide a method and apparatus for coating a surface of an object positioned within an enclosed chamber and also curing the coating on the surface within the chamber.

It is a further object of the invention to provide a method and apparatus for providing a thin film of liquid material on a surface of an object in which the liquid material is moved within a closed system.

According to one aspect of the invention, there is provided a method for forming, within an enclosed chamber, a coating of material on a surface of an object. The method comprises supporting the object within the chamber, providing a sufficient amount of liquid material into the chamber sufficient to cover the surface of the object to be coated and evacuating the excess liquid material from the chamber to leave a coating of material on the surface of said object.

According to another aspect of the invention there is provided apparatus for coating an object with a layer of material. The apparatus includes an enclosed chamber, means for supporting the substrate within the chamber, means for introducing liquid material into said chamber sufficient to cover the surface of said object and means for evacuating the liquid material from the chamber to leave a coating of material on the object.

According to further aspects of the invention there is provided additional method and apparatus based on the method and apparatus described above for simultaneously coating photoresist material on the surfaces of a plurality of substrates or circuit boards and curing the coatings on the substrates within the enclosed chamber.

The foregoing and other objects, features and advantages of the invention will become more apparent from the following detailed description of the preferred embodiments, with reference to the accompanying drawings.

BRIEF DESCRIPTION OF THE DRAWINGS

A preferred embodiment of the present invention will now be described by way of example only, with reference to the accompanying drawings, in which:

FIG. 2 is a drawing of a representative example of the chamber for holding a plate to be coated, showing a perspective (2a) and edge view (2b) of the apparatus.

DETAILED DESCRIPTION OF THE PREFERRED EMBODIMENTS

Figure 1:
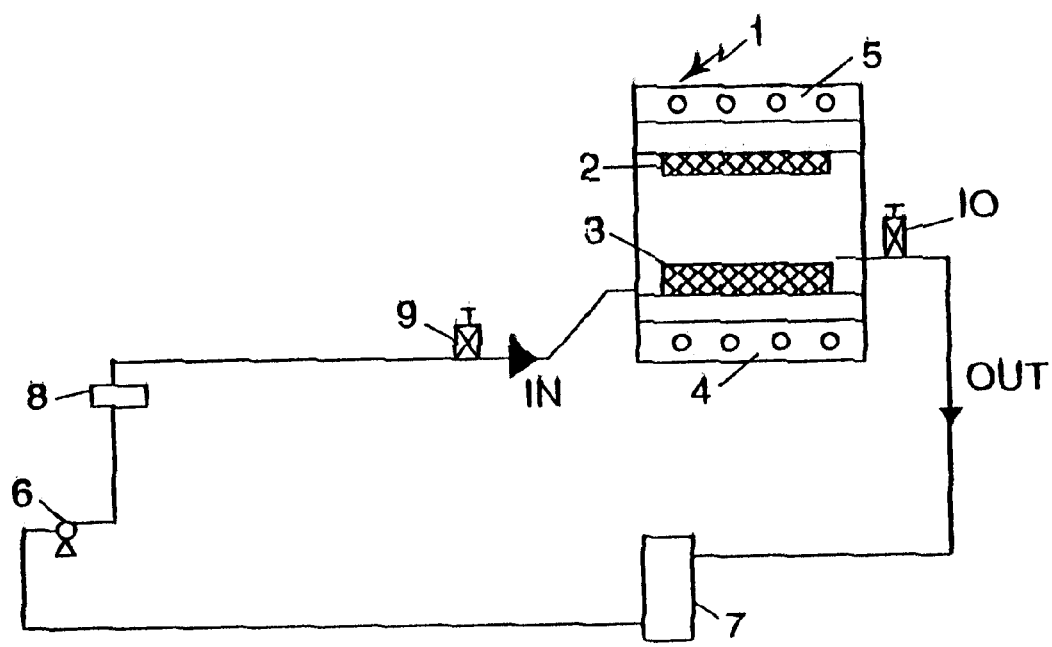
FIG. 1 is a high level schematic drawing of the apparatus that can be used to carry out the method for providing thin films on a substrate, in accordance with the invention.

Before the apparatus for implementing the invention is described, the method, and overview of the invention and some of the technical factors involved in creating a thin uniform film in accordance with the invention will be described.

It is again noted that the present inventive method and apparatus provides for a contamination-free and vibration-free system for forming a uniform layer or film of material on a surface, such as photoresist on a substrate. In general, there is no limitation of the size of the substrate that can be treated, in that the system may be designed to accept objects to be coated of any practical width, length and thickness. If a high throughput of coated parts is desired, then this will justify a larger enclosed chamber, permitting many parts to be coated simultaneously. This would result in greater efficiency. The treatment can result in having resist only on one surface of an object, and not on the back surface of an object which is in plate form, if this is desired. The enclosed chamber is temperature controlled such that the substrate and resist can be maintained at a uniform temperature and the resist can be cured on the substrate within the chamber and thus the chamber acts also as a bake oven.

The object to be coated is placed in an enclosed chamber and the chamber is filled with coating material by pumping the liquid material into the chamber in a known manner. It has been found that the thickness and uniformity of the resulting coating on the substrate is controlled by a number of factors during the coating process. These factors include the temperature of the object which can be controlled when the object is positioned in the chamber and held by means of a combined vacuum holder and heating plate for the object; the viscosity of the liquid material affects the thickness of the resulting coating in that a lower viscosity tends to provide a thinner resulting layer; and lastly the rate of evacuation of the liquid material from the chamber affects the thickness of the coating in that if the liquid is removed quickly, it tends to provide a thicker coating layer on the substrate. Once the desired thickness and uniformity of coating is achieved within the chamber, all the remaining liquid is evacuated from the chamber and the coating on the object can be cured while the object is still in the chamber. As a result of the heating plate which is preferably a part of the vacuum holder for the substrate, the chamber can also act as a bake oven.

With reference to FIG. 1 of the drawings, the overall system for use of the coating chamber of the subject invention will now be described. The chamber in which a layer or film is deposited on a substrate is generally shown by reference 1. Chamber 1 will be described in more detail in the subsequent description of FIG. 2 of the drawings. Substrates to be coated, two of which are shown in FIG. 1 as part 2 and part 3, can be effectively held and introduced into the chamber by a combined vacuum holder and heating plate, two of which are conceptually shown by references 4 and 5, which will be described in more detail subsequently. Heating plates 4 and 5 uniformly control the temperature of the substrate to be coated. The chamber 1 in which the coating process takes place is a sealed chamber. If a coating is intended for only one side of an object or substrate, then this substrate can be held by a combined vacuum holder/heating plate such that the substrate forms an inside side of chamber 1. Different sizes of substrates can readily be accommodated in this manner and a number of substrates could be similarly positioned to form the walls of the chamber. If it is desired that a substrate receive a coating on both sides, then the substrate would be positioned entirely within chamber 1 and held in an appropriate manner. Of course, many substrates could be similarly positioned within chamber 1.

The features of the vacuum holder and the heating plate for the substrate, whether individual or in combination, are not critical to the invention. It is apparent that a source of vacuum to maintain the substrate on the holder would have to be supplied as well as a source of heat for the heating plate. Any conventional means of doing this would be appropriate.

A closed system for handling and directing the liquid material to sealed chamber 1 will now be described with further reference to FIG. 1. Pump 6 draws the liquid material from material reservoir 7 and feeds it through filter 8 and through input valve 9 into closed chamber 1. After chamber 1 has been essentially filled with material for coating substrates or objects 2 and 3 which have been positioned in chamber 1 as illustrated, during the evacuation phase for the coating process, output valve 10 permits the remaining liquid to be evacuated from closed chamber 1 and returned to reservoir 7. Filter 8 removes any contamination that may have been accumulated in the material in reservoir 7 or as a result of the coating process in closed chamber 1.

All features and components of this recycling closed system are readily available and well known on the market and to those skilled in this art, and the details do not form part of the invention. However, the following specific components have been found practical for use in the closed system of FIG. 1: pump 6 is a metering pump model BPB#5529-1.168 supplied from Zenith Nichols Division of W. H. Nichols Company, Waltham, Mass., and filter 8 consisting of filtration cartridge model WGFA16TP2 supplied by Millipore Company, Bedford, Mass.

With reference to FIG. 2 of the drawings, details will now be described of a preferred embodiment of the chamber for holding an object to be coated. The plate or substrate to be coated is shown at 10. This is a specific example of the nature of the parts or objects to be coated as shown more generally at 2 and 3 in FIG. 1. Plate 10 is held on vacuum holder 11 by a source of vacuum supplied and attached to vacuum holder 11, as shown at 12. Vacuum holder 11 also has heating component 13 as a feature thereof. Heating component 13 acts to control the temperature of plate 10 by means of hot and cold water sources connected as shown at 14. An enclosed treatment chamber is continued to be formed by chamber frame 15 in which chamber cover 16 is positioned. Openings 18 are provided in frame 15 for exhausting any vapour arising from the coating material during the coating process. The enclosed chamber is lastly formed by chamber cover frame 17. Chamber frame 15 has an opening 19 for pumping liquid coating material into the enclosed chamber to fill the chamber. Opening 19 is also used to subsequently remove the remaining liquid from the chamber, that is, the liquid which does not form the resulting coating on plate 10. The various parts of the chamber are held together in any appropriate clamping manner to form the enclosure.

It had been found practical to manufacture the various parts of the enclosed chamber consisting of vacuum holder 11, enclosed chamber frame 15 and chamber cover frame 17, from aluminum or aluminum alloy with chamber cover 16 made of glass to permit visual inspection of the coating process and to observe the coating when withdrawal of the coating material occurs. Glass is compatible with many chemicals. Suitable material other then aluminum may be used for the various chamber components.

Again with reference to FIG. 2, heating component 13 which may be associated with vacuum holder 11, is used to heat and cool part 10 to be coated which is held on vacuum holder 11. The heating and cooling resulting from heating component 13 may be determined by controlling the hot and cold water to openings 14 in any well known manner. The temperature of plate 10 is controlled in order to have plate 10 at a uniform temperature and to have the material coated on the plate cured or dried at the correct temperature. Being able to cool the plate has the benefit of being able to accelerate production of the coating of parts and also as a safety factor to prevent overheating. Vacuum holder 11 locates and holds the part to be coated by a series of holes 20 visible on vacuum holder 11 which in turn is connected to a source of vacuum 12. The vacuum for holding the plate 10 on vacuum holder 11 can be provided and controlled in any well known manner. The surface of plate 10 to be coated is typically a planar surface to have the required uniformity of coating applied. Provisions 18 for exhausting vapour from the enclosed chamber frame 15 are required for various reasons. As the coating material is heated, any resulting fumes are evacuated from the chamber so as not to adversely affect the correct thickness and uniformity of the resulting coating. Exhausting of the fumes and vapour prevents the buildup of pressure within the chamber during curing of the coating on the substrate. It has been found that during curing of a typical coating, the coating starts drying at about 52° C. and typically the temperature must be raised to about 95° C. and this requires exhausting of the fumes to permit the hardening of the coating. Depending upon the types of coating material such as various resists, it may be desirable to have a mechanism to control the rate of exhaust from the chamber.

It has been found satisfactory to have only one input/output opening 19 in chamber frame 15 to be used for first causing the coating material to be pumped into the chamber and then evacuating the excess material from the chamber at an appropriate rate in order to achieve the required coating thickness.

Chamber cover 16 is preferably made of glass as this material is compatible with most chemicals that would be used in the coating process. The glass also permits viewing of the coating and the withdrawal of the coating material. Chamber cover 16 is sealed, for example with a gasket, against the chamber frame 15 in order to prevent leakage of the material and breakage of the glass. Chamber cover frame 17 can be held in place by C clamps (not shown), for example, so as to tighten all of the chamber assembly components comprising combined heating component and vacuum holder 11 and 13, plate 10, enclosed chamber frame 15, chamber cover 16 and chamber cover frame 17 and prevent leakage of the coating material from the resulting enclosed chamber.

As shown in the right side of FIG. 2 is an edge view (2*b*) of the assembled chamber as described above. The same reference numbers are used to represent similar components. Although in the preferred embodiment of the invention, a substrate or circuit board is coated only on one side at a time, variations in the invention may be used to provide for the coating of a variety of parts in a batch process so as to create essentially the same thickness of coating on each of the parts, irrespective of the size, quantity or thickness of the parts being coated. It has been found to be preferable to have the plate to be coated positioned in a vertical orientation within the chamber. However, in some cases it may be beneficial to have the plate or substrate positioned in the apparatus at some angle to the vertical.

Although the subject invention can be used to coat a variety of materials on a variety of plates or substrates that are used for various functions, an application where the method and apparatus has been successfully used is to uniformly coat resist material on substrates such that the coated substrate can then be subsequently processed for use in the integrated circuit industry.

In the carrying out of the coating process after the plate has been enclosed in the enclosed and sealed chamber of FIG. 2 and connected and positioned within the closed system of FIG. 1, an operator is able to view through the transparent glass chamber cover 16 to ensure that the liquid coating material or resist sufficiently fills the chamber so as to appropriately cover the part to be coated. The level of the coating liquid has typically been permitted to rise between ½" and 1" above the height of the plate to be coated. After the chamber is filled, there is no critical time for the parts to stay in the chamber. Time is not significant at this point as the system is enclosed and sealed and there are no variable conditions or components within the chamber to change or deteriorate. Thus, any convenient length of time would be appropriate, however the parts to be coated and the resist should be allowed to reach a uniform temperature.

It has been previously described that the desired uniformity and thickness of the coating layer on the substrate is dependent upon the viscosity of the liquid material, the rate of withdrawal of the material from the chamber, and the temperature of the substrate to be coated. Other secondary parameters may also have an effect on the uniformity and thickness of the coating. Since the described system is vibration free and curing of the coating takes place before handling of the coated part or its removal from the chamber, there is no mechanical vibration to adversely affect the coating. It has been found that a minimum curing time of about two minutes should occur otherwise the hardening of the coating may not result and the thickness uniformity may not be achieved. Once the coating material is withdrawn from the chamber at a controlled and constant rate, the thickness of the coating will depend upon the percentage of solid in the resist or its viscosity and thus it should be consistent and homogeneous on the surface of the plate to be coated. In general, it is considered that any flat panel or any size of substrate may be coated using the described invention. The size of the part that may be coated really depends upon the dimensions of the chamber components. A chamber has been designed, for example, to coat flat panels up to 8"×20" in size. Any coating or resist material may be used as long as it is compatible with the chamber components and the various connections, pumps and gaskets.

The process of using the above apparatus to coat a substrate consists of positioning one or more substrates into the enclosed chamber by making use of the vacuum holder/heating plate device. The chamber is enclosed and sealed before the operation begins. Liquid of particular viscosity is selected to form the coating. A temperature setting for the heating plate is selected to uniformly maintain the substrates at a temperature which has been found to be preferably about room temperature of about 21° C. Once the chamber is appropriately sealed, the inlet valve is opened so that the liquid material is pumped from the reservoir, through the filter, into the chamber, filling the chamber with coating material. After an appropriate period of time to enable the temperature of the substrate and liquid material to become uniform, the liquid is then evacuated from the chamber by opening the output valve and pumping the excess liquid back to the reservoir. The amount the output valve is opened controls the rate of evacuation of the liquid material from the chamber.

The surface tension between the upper surface level of the lowering and exiting liquid and the plate causes some of the liquid to remain on the plate surface.

Once the excess liquid material is removed and evacuated from the sealed chamber, the chamber can then act as an oven. This is done by adjusting the heating component associated with the vacuum holder such that the temperature in the oven or the sealed chamber is appropriate to cure the remaining film of liquid material coating the substrate. The substrate, with the desired thin film layer or coating fixed on the surface, is then removed from the chamber.

If it has been found after an initial coating that the film of material is not of the desired thickness or it is desired to simply increase the thickness of the film, then the above process can be repeated.

A description will now be provided of the details and of the parameters for a practical application of the described inventive method and apparatus to coat a resist on the surface of a substrate.

To coat a vertically positioned substrate within the chamber, initial consideration must be given as to the type of resist to be used for the coating, the percentage of solvent in the resist, the temperature of the substrate and liquid resist being uniform and about at room temperature, the speed or rate of withdrawing the remaining resist from the chamber, and the curing time and temperature of the film of resist remaining on the plate as a result of surface tension, and the movement of the bulk of the resist down the surface of the plate. In this description although it may be appropriate to measure the actual viscosity of the coating liquid or determine the percentage of solids in the coating liquid, the percentage of solvent is considered to be a measure of viscosity. Good results have been found by use of the following supplied materials including: substrate material glass borosilicate of a size 2 mm×20 cm×51 cm supplied by Berliner Glas Inc., Williamsburg, Va.; liquid photoresist S1811 Microposit from Shipley Company Inc., Marlborough, Mass.; and the solvent Glycol Ether PM for the photoresist supplied by Dow Chemical Canada Inc., Sarnia, Ontario. It has been found that the variation in thickness of the resultant photoresist film or coating depends upon the percentage of solvent that is mixed with the S1811 photoresist or in other words, the viscosity of the photoresist. Variations in the resulting thickness of the film have been as follows: 25% of solvent produces a film of 0.150 $\mu$m; 50% of solvent results in a film of 0.520 $\mu$m; and 100% (no added solvent) photoresist S1811 results in a coating of 2.0 $\mu$m.

It has further been determined that the speed or rate of withdrawing the photoresist from the chamber directly affects the thickness of the layer in that a 50% by volume of solvent and the S1811 photoresist wherein the liquid is withdrawn at a rate of 0.0142" per second results in a film thickness on the substrate of 0.520 $\mu$m and a similar mixture with a slightly increased speed of 0.0480" per second withdrawal of the excess liquid resist results in a film thickness of 0.845 $\mu$m.

In general, the curing temperature recommended by the manufacturer of the resist is followed. It has been found that the time and temperature for curing really has a minimal influence, if any, on the thickness of the resulting film, as the thickness is really related to the viscosity or the amount of solvent in the resist. Once the solvent is evaporated from the film on the substrate, the solid remains when the curing occurs.

It is preferable to maintain the temperature of the substrate and liquid resist at about room temperature during the adding and removal of the liquid resist from the chamber. To cure the resultant photoresist film on the surface of the substrate, the temperature is set according to the specifications provided by the supplier of the photoresist. In general, it has been found that the temperature of the plate could be in the range of 90 degrees C. up to 115 degrees C. for a period of time of about 2 minutes in order to properly cure the resultant photoresist film on the substrate. In general, the curing temperature and time may be varied according to the nature of the resist that is used. However, the resist should be dried in order to prevent the resist from sliding on the surface of the substrate before it is cured, thereby adversely affecting the uniformity. The resultant cured resist should be hard enough to prevent any abrasions when measuring the thickness and further processing. As has been indicated previously, in order to achieve uniform results, the chamber should be filled with liquid photoresist so that the level is above the surface to be coated and when the chamber is evacuated, the level of the resist should be at least ¼" below the bottom edge of the substrate. In general, these conditions can be determined by viewing the level of the photoresist through the glass chamber cover.

The disclosed method and apparatus has been found practical to apply a resist film on a flat panel or circuit board without any circuit topography and has been considered for applying masking material on a plate up to 18" in size and a large flat panel up to 24"×36" in size. Both sides of a substrate could be coated at the same time by adapting the enclosed chamber of FIG. 2 as would be apparent to those skilled in the art. A plurality of substrates and various sizes of substrates could be coated by vertically positioning the substrates and held along their bottom edges in a carrier or basket device within the enclosed chamber, as would be apparent. This results in an efficient system with reduced time and workload. Any batch size of substrates could be accommodated depending upon the dimensions of the substrates and chamber, thereby achieving a volume production. By being able to cure the coating within the chamber, no separate bake oven is required and time and handling of the substrates is reduced.

The described invention may find its usefulness in most applications where the surfaces of substrates to be coated are flat and have no circuit topology present. However use of the invention is not limited to such flat surfaces having no circuit topology thereon. The described inventive method and apparatus may be used to provide coatings on printed circuit or printed wiring boards, cards or other carriers which have circuits and circuit components formed on them, such as screened circuit patterns. The materials and topology of the surface must be such that surface tension between the receding level of the coating liquid within the chamber and the substrate surface is maintained so that a coating of the liquid remains on the substrate surface.

Although preferred and somewhat specific embodiments of the method and apparatus for providing uniform coatings on flat surfaces of substrates has been described, it will be apparent to those skilled in the art that many alternatives and changes may be introduced to what has been described without digressing from the spirit of the disclosed invention.

The embodiments of the invention in which an exclusive property or privilege is claimed are defined as follows:

1. A method for coating a film of material on a single surface of a flat substrate, said method being carried out within an enclosed chamber and comprising the steps of:

supporting the substrate in a vertical orientation on a vacuum holder within said chamber;

providing an amount of material in liquid form through an opening into said chamber sufficient to cover the surface of the substrate to be coated;

evacuating excess liquid material from the enclosed chamber through an opening to leave a coating of material on the surface of said substrate, and heating the substrate at a uniform temperature to cure said coating of material on the surface of the substrate while on the vacuum holder within the chamber.

2. The method of claim 1 wherein said coating material is a photoresist.

3. The method of claims 1 or 2 wherein the thickness of the resulting coating on the surface of the substrate is dependent upon the selected viscosity of the liquid material and the rate of evacuation of the excess liquid material from the chamber.

4. The method according to claim 1 wherein the same opening is used for providing liquid material into the chamber for evacuating liquid material from the chamber.

5. A closed system for coating a single surface of a flat substrate with a layer of material comprising:

an enclosed chamber having a vacuum holder including a heating component for supporting the substrate in the chamber in a vertical orientation;

means for introducing material in liquid form into said chamber to cover the surface of said object to be coated;

means for evacuating liquid material from the chamber so as to leave a coating of material on the surface of said substrate, and the heating component including means for uniformly heating the substrate for curing said coating on the surface of the substrate on the vacuum holder with the chamber.

6. The system of claim 5 wherein said means for evacuating the liquid material from the chamber is adapted to evacuate the material at different rates of evacuation.

7. The system of claim 5 wherein said heating component uses hot and cold water to vary the temperature of the substrate.

8. The system according to claim 5 further including a material reservoir, a pump on the inlet to the chamber to draw the liquid material from the reservoir into the closed chamber, and means on the outlet of the chamber to evacuate the remaining liquid from the closed chamber.

9. The closed system according to claim 8 wherein the inlet and the outlet comprise a single opening.

10. A closed system for coating a single surface of a flat substrate with a layer of material comprising;

an enclosed chamber having means for vacuum holding and heating the substrate in the chamber in a vertical orientation;

frame means interacting with said holding means to form a sealed chamber enclosing the substrate, said surface of the substrate forming an interior wall of the enclosed chamber;

means for introducing material in liquid form into said chamber to cover the surface of said substrate to be coated;

means for evacuating liquid material from the chamber so as to leave a coating of material on the surface of said substrate, and means for uniformly heating said surface to cure the coating on said surface of the object within said chamber.

11. The system of claim 10 wherein said frame means includes a transparent cover permitting viewing of the substrate and the liquid material within the chamber.

12. The system of claim 10 wherein the material to be coated on the substrate is a resist and said frame means includes means for exhausting resist vapour and fumes from the enclosed chamber.

13. The system according to claim 12 wherein the frame includes an opening means for the resist to enter the chamber and additional opening means for exhausting the vapor and fumes.

* * * * *